(12) United States Patent
Kim et al.

(10) Patent No.: US 8,704,283 B2
(45) Date of Patent: Apr. 22, 2014

(54) SEMICONDUCTOR DEVICES

(75) Inventors: Jong-Kyu Kim, Hwseong-si (KR);
Sang-Sup Jeong, Suwon-si (KR);
Sung-Gil Choi, Yongin-si (KR);
Heung-Sik Park, Yongin-si (KR);
Kuk-Han Yoon, Hwaseong-si (KR);
Yong-Joon Choi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 901 days.

(21) Appl. No.: 12/724,450

(22) Filed: Mar. 16, 2010

(65) Prior Publication Data

US 2010/0237466 A1    Sep. 23, 2010

(30) Foreign Application Priority Data

Mar. 17, 2009  (KR) .................. 10-2009-0022605

(51) Int. Cl.
*H01L 27/108*  (2006.01)

(52) U.S. Cl.
USPC ........... 257/296; 257/300; 257/301; 257/302; 257/303; 257/304; 257/306

(58) Field of Classification Search
USPC ................... 257/296, 300–304, 306
See application file for complete search history.

(56) References Cited

U.S. PATENT DOCUMENTS 7,067,385 B2    6/2006  Manning
2005/0051822 A1*   3/2005  Manning .................. 257/296

FOREIGN PATENT DOCUMENTS

KR    1020050119498 A    12/2005
KR    10-0716641         5/2007

\* cited by examiner

*Primary Examiner* — Samuel Gebremariam
(74) *Attorney, Agent, or Firm* — Volentine & Whitt, PLLC

(57) ABSTRACT

A semiconductor device includes a lower electrode, a supporting member enclosing at least an upper portion of the lower electrode, a dielectric layer on the lower electrode and the supporting member, and an upper electrode disposed on the dielectric layer. The supporting member may have a first portion that extends over an upper part of the sidewall of the lower electrode, and a second portion covering the upper surface of the lower electrode. The first portion of the supporting member protrudes above the lower electrode.

16 Claims, 15 Drawing Sheets

SEMICONDUCTOR DEVICES

BACKGROUND

1. Field

The present inventive concept relates to semiconductor devices and to methods of manufacturing semiconductor devices. More particularly, the inventive concept relates to semiconductor devices having components, such as capacitors, including lower electrodes and supporting members for supporting the lower electrodes. The inventive concept also relates to methods of manufacturing the same.

2. Description of the Related Art

If a semiconductor memory device, such as a dynamic random access memory (DRAM) device, is to have a high degree of integration, the semiconductor memory device must have a required or high capacitance and yet occupy a relatively small footprint. To this end, the effective area of lower electrodes of capacitors of semiconductors device have been maximized in various ways. For example, it is known to form the lower electrode perpendicularly to a substrate of the semiconductor device so as to have a considerable height, thereby ensuring that the semiconductor memory device has a desired capacitance without increasing the footprint of the capacitor. However, such a relatively tall lower electrode may fall down or may lean against an adjacent lower electrode before a dielectric layer of the capacitor is formed on the lower electrode. The likelihood of these problems occurring increases as the height of the lower electrode increases.

In view of the above-mentioned problem, a supporting element such as a bar-shaped element has been developed to support a lower electrode of a capacitor. However, an upper edge portion of the lower electrode may be easily damaged while the supporting element is being formed or polymer residue may remain on the lower electrode to thereby cause defects in the capacitor.

SUMMARY

According to an aspect of the inventive concept, there is provided a semiconductor device including a lower electrode, and a supporting member that stably supports the lower electrode while preventing the lower electrode from being damaged during the fabrication of the device. The lower electrode includes a vertical sidewall and an upper surface at a top of the sidewall. The supporting member encloses an upper portion of the lower electrode and protrudes above the lower electrode so as to thereby extend beyond the level of the upper surface of the lower electrode. In addition, a dielectric layer extends over and is conformed to the topography of the lower electrode and the supporting member. An upper electrode is disposed on the dielectric layer.

According to another aspect of the inventive concept, there is provided a semiconductor device including first and second rows of lower electrodes, a supporting member that stably supports the lower electrodes while preventing the lower electrodes from being damaged during the fabrication of the device, a dielectric layer and an upper electrode. The lower electrodes of the first row are aligned with one another in a first direction on the substrate, and the lower electrodes of the second row are also aligned with one another in the first direction on the substrate such that the first and second rows of the lower electrodes are substantially parallel. Also, each of the lower electrodes is elongated in a direction substantially perpendicular to the substrate so as to have a sidewall and an upper surface at a top of the sidewall. The supporting member is a contiguous member that contacts upper portions of the sidewalls of both the lower electrodes in the first row and the lower electrodes in the second row. Also, the supporting member protrudes above the lower electrodes so as to have a surface disposed at a level above that of the upper surfaces of the lower electrodes. The dielectric layer is disposed on the lower electrodes and the supporting member. The upper electrode is disposed on the dielectric layer.

According to still another aspect of example embodiments, there is provided a method of manufacturing a semiconductor device, which includes forming a plurality of lower electrodes and a supporting member that stably supports and protects the lower electrodes as the device is being fabricated. First and second rows of the lower electrodes are formed on a substrate. Each of the lower electrodes is formed so as to be elongated in a direction substantially perpendicular to the substrate. Thus, each of the lower electrodes has a sidewall and an upper surface at a top of the sidewall. Furthermore, the lower electrodes of the first row are aligned with one another in a first direction on the substrate, and the lower electrodes of the second row are also aligned with one another in the first direction on the substrate. Accordingly, the first and second rows of the lower electrodes are substantially parallel. The supporting member is formed so as to contact upper parts of the sidewalls of the lower electrodes of both the first row and the second row, and so as to have an upper surface disposed at a level above the upper surface of each of the lower electrodes. Then a dielectric layer is formed on the lower electrodes and the first supporting member. Next, an upper electrode is formed on the dielectric layer.

BRIEF DESCRIPTION OF THE DRAWINGS

The inventive concept will be more clearly understood from the following detailed description of the preferred embodiments thereof made in conjunction with the accompanying drawings.

FIGS. 2B, 3B, 4, 5, 6B, 7B, 8B and 9B are cross-sectional views taken along lines I-I' in FIGS. 2A, 3A, 6A, 7B, 8A and 9A, respectively.

DETAILED DESCRIPTION OF THE PREFERRED EMBODIMENTS

Figure 1:
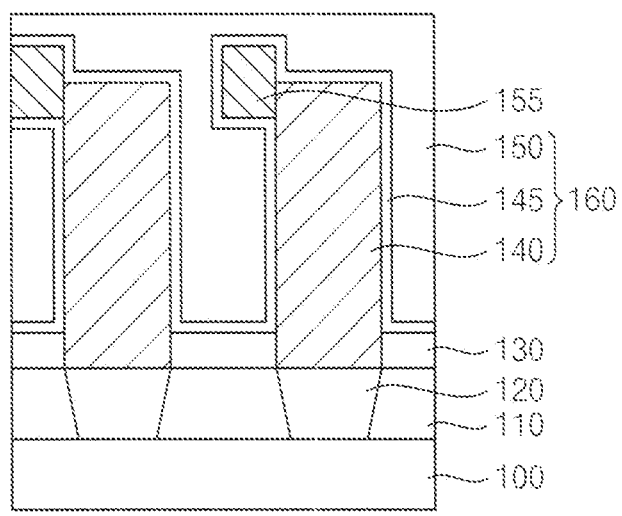
FIG. 1 is a cross-sectional view of an embodiment of a semiconductor device in accordance with the inventive concept.

This application claims priority under 35 U.S.C. §119 to Korean Patent Application No. 2009-0022605, filed on Mar. 17, 2009 in the Korean Intellectual Property Office (KIPO).

Various examples of a semiconductor device embodied in accordance with the inventive concept, and methods of manufacturing the same, will be described more fully hereinafter with reference to the accompanying drawings. Like reference numerals are used to designate like elements throughout the drawings. Also, in the drawings, the sizes and relative sizes of components, layers and structures (elements) may be exaggerated for clarity. In particular, cross-sectional views are schematic in nature and thus illustrate at least some of the elements in an idealized manner. As such, the shapes of at least some of the elements in an actual semiconductor device in accordance with the inventive concept may vary from those illustrated due, for example, to manufacturing techniques and/or tolerances.

Furthermore, spatially relative terms, such as "upper" and "lower" are used to describe an element's to another element (s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can, when in use, assume orientations different than those illustrated in the drawings.

Referring to FIG. 1, a semiconductor device according to the inventive concept includes a substrate 100, an insulating interlayer 110, a plug 120, an etch stop layer 130, a capacitor 160 and a supporting member 155. The capacitor 160 includes a lower electrode 140, a dielectric layer 145 and an upper electrode 150.

The substrate 100 may include a cell area and a peripheral circuit area. In this case, the peripheral circuit area may surround the cell area. Memory cells may be located in the cell area and logic elements for controlling the memory cells may be located in the peripheral circuit area. The substrate 100 may be a semiconductor substrate or may comprise a substratum having a semiconductor layer thereon. For example, the substrate 100 may comprise a silicon (Si) substrate, a germanium (Ge) substrate, a silicon-germanium (Si—Ge) substrate, a silicon-on-insulator (SOI) substrate, or a germanium-on-insulator (GOI) substrate.

A conductive structure (not illustrated) such as a switching element may be provided on the substrate 100. For example, the switching element may be a transistor such as a metal oxide semiconductor (MOS) transistor. Furthermore, underlying structures may be disposed on the substrate 100. Examples of the underlying structures include conductive layer patterns, insulation layer patterns, contacts, plugs, spacers, and impurity regions.

The insulating interlayer 110 is disposed on the substrate 100. The insulating interlayer 110 covers any conductive structure and/or the underlying structures provided on the substrate 100. The insulating interlayer 110 may comprise an oxide such as silicon oxide. For example, the insulating interlayer 110 may comprise boro-phosphor silicate glass (BPSG), phosphor silicate glass (PSG), undoped silicate glass (USG), spin on glass (SOG), flowable oxide (FOX), Tonen silazene (TOSZ), plasma enhanced-tetraethylorthosilicate (PE-TEOS), or a high density plasma-chemical vapor deposition (HDP-CVD) oxide.

The plug 120 is located on the substrate 100 and extends through the insulating interlayer 110. That is, the plug 120 may be buried in the insulating interlayer 110 whereas the plug 120 may be exposed at an upper surface of the insulating interlayer 110. The plug 120 may contact a predetermined portion of the substrate 100. The plug 120 may be of polysilicon, a metal and/or a metal compound. For example, the plug 120 may comprise polysilicon doped with impurities, tungsten (W), copper (Cu), titanium (Ti), aluminum (Al), tantalum (Ta), tungsten nitride (WNx), aluminum nitride (AlNx), titanium nitride (TiNx), tantalum nitride (TaNx), or a combination of layers thereof. The plug 120 electrically connects the capacitor 160 to the predetermined portion of the substrate 100.

The predetermined portion of the substrate 100 may be a contact region, an impurity region, or a diffusion region. When a switching element such as a transistor is disposed on the substrate 100, the predetermined portion of the substrate 100 is a source/drain region of the transistor.

The etch stop layer 130 is disposed on the insulating interlayer 110 and exposes the plug 120. The etch stop layer 130 may also extend between adjacent ones of the lower electrodes 140. The etch stop layer 130 may comprise a nitride or oxynitride. For example, the etch stop layer 130 may be a layer of silicon nitride or a layer of silicon oxynitride. The etch stop layer 130 prevents the plug 120 and the insulating interlayer 110 from being damaged in successive etching processes of removing at least one mold layer used for forming the lower electrode 140 (described later on).

The lower electrode 140 of the capacitor 160 is disposed on the plug 120. Also, a lower portion of the lower electrode 140 is buried in the etch stop layer 130. The lower electrode 140 is elongated in a direction substantially perpendicular to the substrate 100.

The lower electrode 140 may comprise polysilicon, a metal and/or a metal compound. For example, the lower electrode 140 may comprise polysilicon doped with impurities, titanium, titanium nitride, aluminum, aluminum nitride, titanium aluminum nitride (TiAlxNy), tantalum, tantalum nitride, or combinations of layers thereof. More specifically, the lower electrode 140 may consist of a single layer of polysilicon, a single layer of a metal or a single layer of a metal compound. Alternatively, the lower electrode 140 may have a multi-layered structure that includes at least one layer of material selected from the group consisting of polysilicon, metals and metal compounds.

In any case, the lower electrode 140 is in the form of a pillar whose cross section has, for example, a circular, polygonal, or elliptical shape. That is, as mentioned above, the lower electrode 140 is elongated in a direction substantially perpendicular to the substrate 100. Furthermore, an upper surface of the lower electrode 140 extends substantially parallel to (the plane of) the substrate 100.

In practical applications, as has been alluded to above, a plurality of the lower electrodes 140 are disposed over the substrate 100. The lower electrodes 140 may be arranged in a plurality of rows (hereinafter, referred to as "lower electrode rows") each extending in a first direction, and which rows are spaced apart from each other in a second direction substantially perpendicular to the first direction. The lower electrodes 140 in each of the lower electrode rows may be staggered or offset, in the first direction, relative to the lower electrodes of each row adjacent thereto in the second direction. That is, in adjacent first and second ones of the lower electrode rows, each lower electrode 140 in the second lower electrode row may be located between adjacent lower electrodes 140 of a respective pair thereof in the first lower electrode row.

Figure 9A:
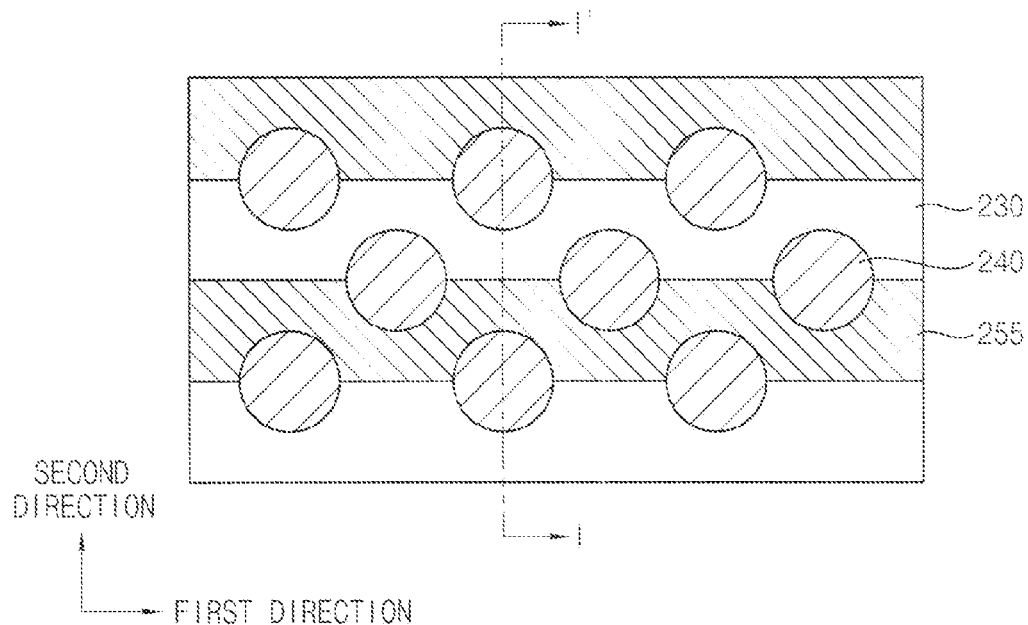
Figure 9B:
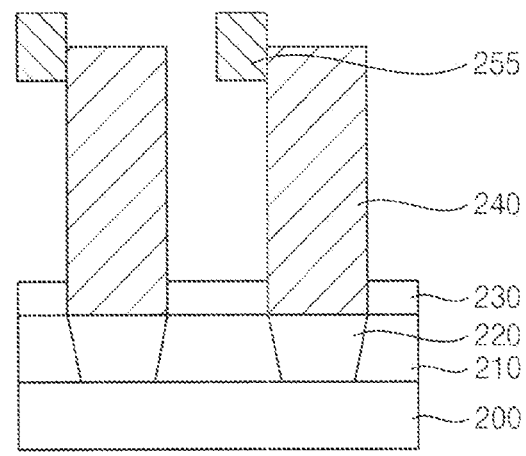

The supporting member 155 is disposed against the lower electrode 140. More specifically, the supporting member 155 may extend across and against an upper portion of a sidewall of the lower electrode 140. Also, the supporting member 155 encloses at least half of an upper portion the lower electrode 140 (best seen in FIGS. 9A and 9B showing a step in a process of manufacturing a semiconductor device of the type shown in FIG. 1). In the embodiment of FIG. 1, for example, the supporting member 155 encloses a circumferential half of an upper portion of the lower electrode 140. Furthermore, in an example of the embodiment of FIG. 1, each supporting member 155 extends over the substrate 100 longitudinally, i.e., is elongated, in the first direction. Also, each supporting member 155 is interposed between lower electrodes 140 (or rows of lower electrodes) that are adjacent in the second direction.

Also, in the embodiment of FIG. 1, a lower portion of the supporting member 155 is disposed against the upper portion of the lower electrode 140 whereas an upper portion of the supporting member 150 protrudes from the lower electrode 140. Thus, an upper surface of the supporting member 155 is located at a level above that of the upper surface of the lower electrode 140. Accordingly, the lower electrode 140 is prevented from being damaged during an etching process carried out to form the supporting member 155 (described later on). Therefore, the lower electrode 140 may have an adequate height without incurring any damage due to the necessity of providing the supporting member 155.

Still further, in an example of the embodiment of FIG. 1, a respective supporting member 155 contacts all of the lower electrodes rows in adjacent rows of the lower electrodes 140, for each alternate pair of adjacent rows of the lower electrodes 140. For example, in a case in which a device according to the inventive concept has first to fourth lower electrode rows on the substrate 100 disposed one after the other in the second direction, one portion of the supporting member 155 contiguously contacts the lower electrodes 140 in both the first and the second lower electrode rows, and another supporting member 155 contiguously contacts the lower electrodes 140 in the third and fourth lower electrode rows. However, no supporting member 155 is provided between and in contact with the lower electrodes 140 in the second and third lower electrode rows.

In the above-described examples in which a supporting member 155 contacts at least two lower electrodes 140, the supporting member 155 provides an enhanced structural stability of the lower electrodes 140, i.e., is highly effective in preventing the lower electrodes 140 from leaning and/or falling down.

The dielectric layer 145 is disposed on the lower electrode 140 and the supporting member 155. In particular, the dielectric layer 145 is a conformal layer whose profile corresponds to the profiles of the lower electrode 140 and the supporting member 155. Accordingly, the dielectric layer 145 covers the entire exposed outer surface of the supporting member 155 even though the supporting member 155 has an overhanging structure with respect to the lower electrode 140. The dielectric layer 145 may comprise a layer of metal oxide having a high dielectric constant. For example, the dielectric layer 145 may comprise a layer of hafnium oxide (HfOx), titanium oxide (TiOx), aluminum oxide (TiOx), or zirconium oxide (ZrOx). Alternatively, the dielectric layer 145 may include at least one oxide film and/or at least one nitride film. For example, the dielectric layer 145 may include an oxide film, a nitride film and an oxide film (e.g., the dielectric layer 145 may have an ONO structure).

The upper electrode 150 is disposed on the dielectric layer 145. The upper electrode 150 may fill the gap between adjacent lower electrodes 140. Thus, the lower electrodes 140, the dielectric layer 145 and the supporting members 155 may be buried in the upper electrode 150. Also, the upper electrode 150 may have a level (flat) upper surface.

The upper electrode 150 may comprise polysilicon, a metal and/or a metal compound. For example, the upper electrode 150 may comprise polysilicon doped with impurities, titanium, titanium nitride, tantalum, tantalum nitride, aluminum, aluminum nitride, titanium aluminum nitride, or a combination of layers thereof. More specifically, the upper electrode 150 may consist of a single layer of polysilicon film, a single layer of a metal film or a single layer of a metal compound film. Alternatively, the upper electrode 150 may have a multilayered structure that includes at least one layer of material selected from the group consisting of polysilicon, metals and metal compounds.

A method of manufacturing a semiconductor device in accordance with the inventive concept will now be described with reference to FIGS. 2A through 9B.

Figure 2A:
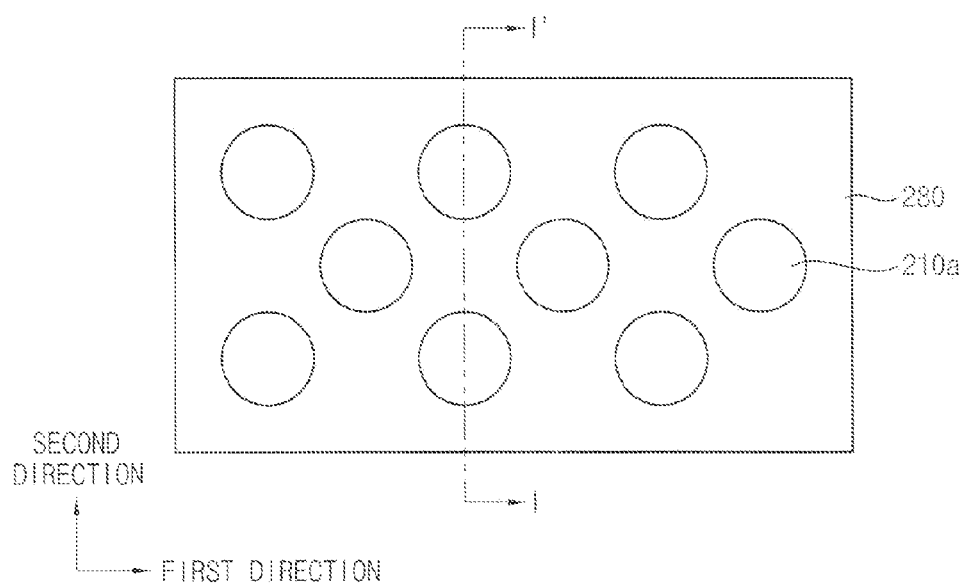
FIGS. 2A, 3A, 6A, 7B, 8A and 9A are plan views illustrating a method of manufacturing a semiconductor device of the type shown in FIG. 1, in accordance with the inventive concept.
Figure 2B:
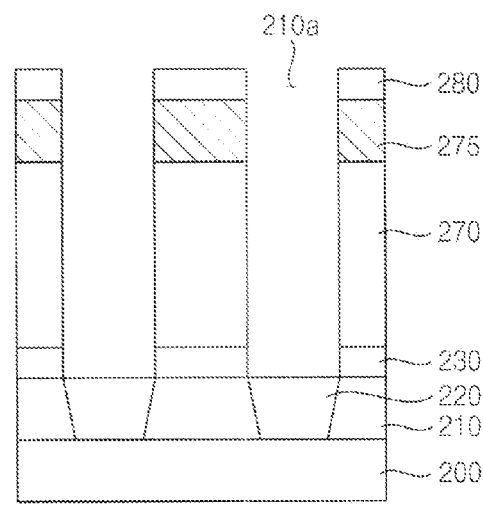

Referring first to FIGS. 2A and 2B, a substrate 200 is provided. Conductive structures and/or underlying structures such as switching elements, patterns, regions and/or layers may also be provided on the substrate 200. Then an insulating layer is formed on the substrate 200 to cover any of the conductive structures and/or the underlying structures, the insulating layer is etched to form an opening therethrough, and the opening is filled with conductive material, to produce an insulating interlayer 210 and a plug 220 extending through the insulating interlayer 210. The plug 220 thus contacts a predetermined region of the substrate 200, e.g., a contact region, a diffusion region, or an impurity region.

The insulating interlayer 210 may be formed of an oxide, e.g., USG, SOG, PSG, BPSG, FOX, TOSZ, TEOS, PE-TEOS, or an HDP-CVD oxide. The insulating interlayer 210 may be formed by a CVD process, a PECVD process, a spin coating process, or an HDP-CVD process. The plug 220 may be formed of conductive material selected from the group consisting of doped polysilicon, various metals, and/or various metal compounds. The opening in the insulating layer may be overfilled with the conductive material, in which case the conductive material is subjected to a chemical mechanical polishing (CMP) process and/or an etch-back process such that the resulting plug 220 is buried in the insulating interlayer 210.

A first mold layer 270, a supporting layer 275 and a second mold layer 280 are successively formed on the insulating interlayer 210. However, an etch stop layer 230 is formed on the insulating interlayer 210 before the first mold layer 270 is formed such that the etch stop layer 230 will be located between the insulating interlayer 210 and the first mold layer 270. The etch stop layer 230 may cover the plug 220 buried in the insulating interlayer 210. The etch stop layer 230 is formed of material having an etching selectivity relative to the first mold layer 270, the second mold layer 280, and the insulating interlayer 210. For example, the etch stop layer 230 may comprise a nitride such as silicon nitride or an oxynitride such as silicon oxynitride.

Each of the first mold layer 270 and the second mold layer 280 may be formed of an oxide (the same oxide or different oxides). For example, the first and the second mold layers 270 and 280 may be formed of TEOS, PE-TEOS, USG, TOSZ, BPSG, FOX, or an HDP-CVD oxide. Thus, the first and the second mold layers 270 and 280 may be formed by a CVD process, a PECVD process, an HDP-CVD process, or a spin coating process.

The supporting layer 275 may be formed of an amorphous material, a nitride or an oxynitride. More specifically, the supporting layer 275 may be formed of silicon nitride, silicon oxynitride, amorphous silicon, amorphous carbon or a combination of these materials. The supporting layer 275 may be coated on the first mold layer 270 by a CVD process, a PECVD process, an HDP-CVD process, etc.

A first opening 210a for a capacitor is formed through the second mold layer 280, the supporting layer 275, the first mold layer 270 and the etch stop layer 230 by etching the second mold layer 280, the supporting layer 275, the first mold layer 270 and the etch stop layer 230. For example, the first opening 210a is formed by an anisotropic etching process. The first opening 210a exposes at least a portion of the plug 220 provided on the substrate 200.

In a practical application of this embodiment, a plurality of first openings 210a are formed in a plurality of rows (hereinafter, referred to as "opening rows") each extending in a first direction. The first openings 210a in each of the opening rows may be staggered or offset, in the first direction, relative to the first openings 210a in each opening row adjacent thereto. Alternatively, the first openings 210a may be arranged in a matrix of rows and columns, wherein each first opening 210a in a row is aligned with a first opening 210a in each of the other rows to form a respective one of the columns. In any case, the first openings 210a are formed in a pattern corresponding to the desired layout of the capacitors to be formed on the substrate 200. Furthermore, the first mold layer 270 is formed to a thickness based on the desired capacitance of the capacitors. That is, the thicker the first mold layer 270, the greater capacitance will be of the capacitors that are formed.

Figure 3A:
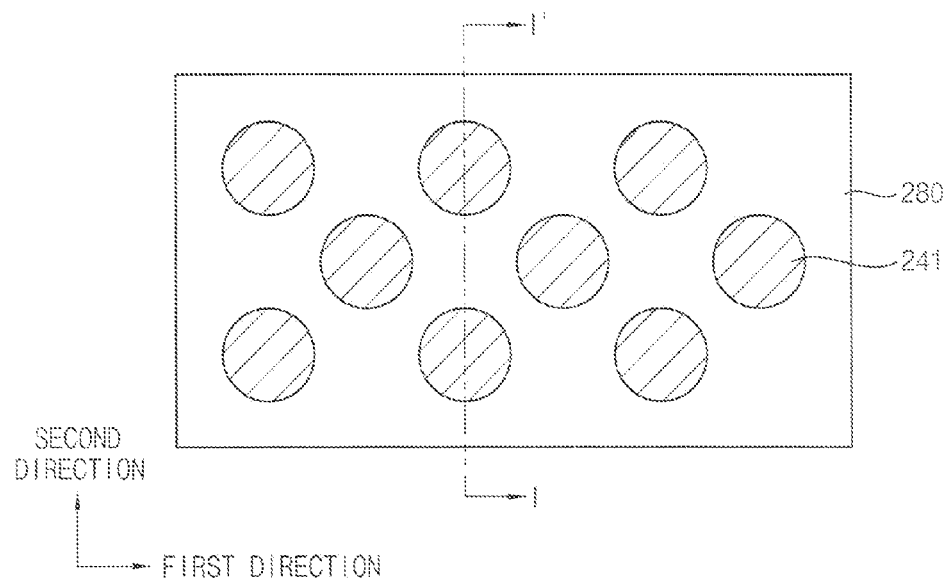
Figure 3B:
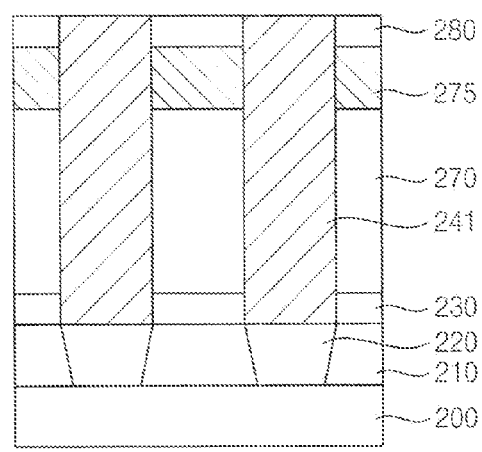

Referring to FIGS. 3A and 3B, a preliminary lower electrode 241 is formed in the first opening 210a. The preliminary lower electrode 241 is formed of conductive material such as doped polysilicon, a metal and/or a metal compound. For example, the preliminary lower electrode 241 may be formed of polysilicon doped with impurities, titanium, titanium nitride, tungsten, tungsten nitride, tantalum, tantalum nitride, aluminum, aluminum nitride, zirconium nitride or combinations of these materials. Furthermore, the preliminary lower electrode 241 may be formed by a CVD process, an ALD process, a sputtering process, an evaporation process, or a pulsed laser deposition (PLD) process.

In the present embodiment, the preliminary lower electrode 241 is produced overfilling the first opening 210a with conductive material to form a conductive layer on the second mold layer 280, and then removing material of the conductive layer until the second mold layer 280 is exposed. The excess conductive material may be removed by a CMP process and/or an etch-back process. As a result, the upper surface of the preliminary lower electrode 241 and the upper surface of the second mold layer 280 are substantially coplanar.

Figure 4:
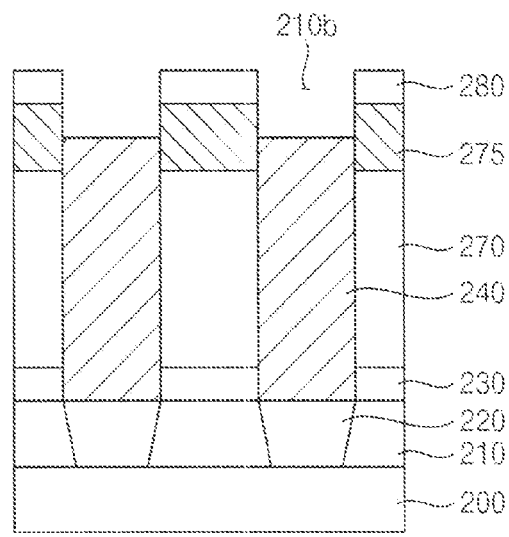

Referring to FIG. 4, an upper portion of the preliminary lower electrode 241 is removed to form a lower electrode 240 in the first opening 210a. For example, the upper portion of the preliminary lower electrode 241 is removed by a dry etching process. In this example, the etching is carried out until the upper surface of the lower electrode 240 is disposed at a level substantially beneath the level of the upper surface of the supporting layer 275 and yet still substantially above the level of the upper surface of the first mold layer 270. That is, the etching is carried out until the edge of the upper surface of the lower electrode 240 contacts a sidewall of the supporting layer 275. The remnant of the first opening 210a constitutes a second opening 210b that exposes a sidewall of the second mold layer 280 and part of the sidewall of the supporting layer 275 which sidewalls delimited the first opening 210a.

Figure 5:
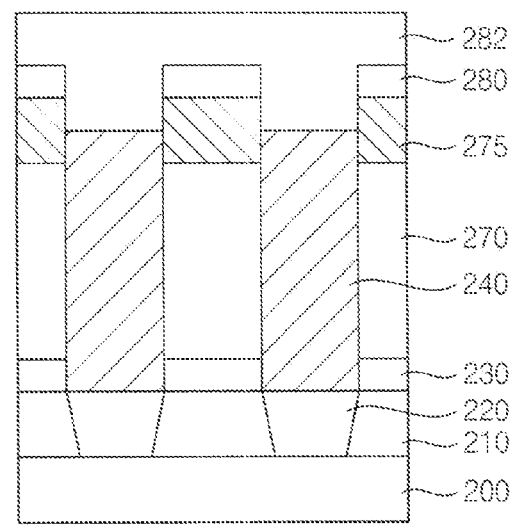

Referring to FIG. 5, a capping layer 282 is formed on the second mold layer 280 and the lower electrode 240 to fill the second opening 210b. The capping layer 282 may be formed of an oxide such as silicon oxide by a CVD process, a PECVD process, a spin coating process, or an HDP-CVD process. For example, the capping layer 282 may comprise TEOS, an HDP-CVD oxide, PSG, USG, SOG, FOX, TOSZ, or BPSG. In an example of the present embodiment, the capping layer 282 is formed of material similar to that of the first mold layer 270 and/or the second mold layer 280. Also, the capping layer 282 has an etching selectivity with respect to the supporting layer 275.

Figure 6A:
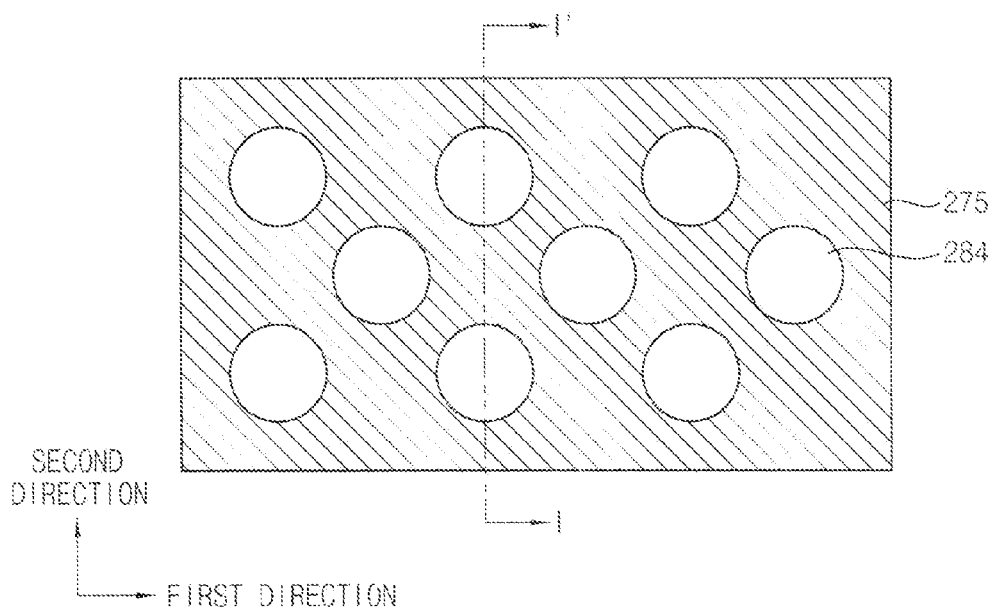
Figure 6B:
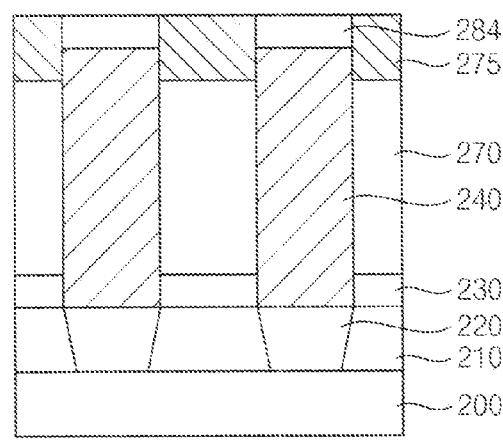

Referring to FIGS. 6A and 6B, a portion of the capping layer 282 and the second mold layer 280 are removed (e.g., by a CMP process and/or an etch-back process). The capping layer 282 prevents the lower electrode 240 from being damaged while the second mold layer 280 is removed. Also, in the case in which the capping layer 282 is of material similar to that of the second mold layer 280, the capping layer 282 and the second mold layer 280 may be simultaneously etched, i.e., may be etched by one etching process. As a result, the supporting layer 275 is exposed and a capping layer pattern 284 is formed in which a respective remnant of the capping layer 282 remains on each lower electrode 240 as filling the second opening 210b. The remnant of the capping layer may have various cross-sectional shapes, e.g., circular (as shown in FIGS. 6A and 6B), polygonal, or elliptical.

Figure 7A:
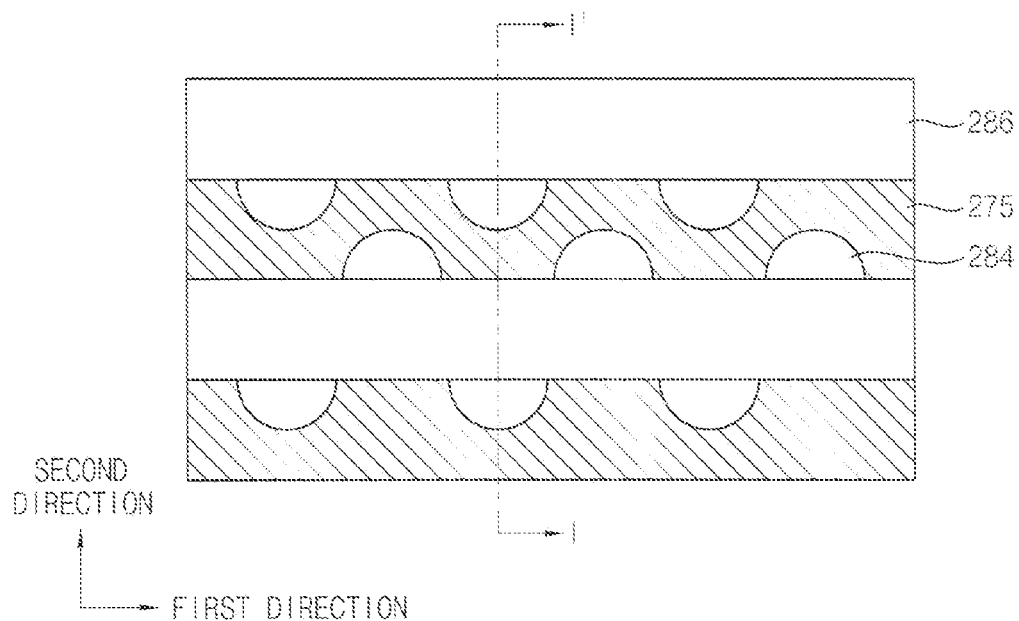
Figure 7B:
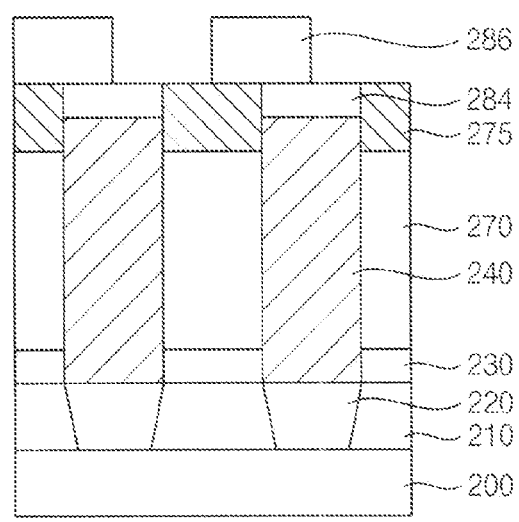

Referring to FIGS. 7A and 7B, a photoresist pattern 286 is formed on the supporting layer 275 and the capping layer pattern 284 by a process that is conventional per se (e.g., by depositing a photoresist layer, exposing the photoresist layer and then developing the photoresist layer to remove portions of the layer). The photoresist pattern 286 may be a line pattern. In the present embodiment, the lines of the photoresist pattern 286 each extend longitudinally in the first direction. However, the lines of the photoresist pattern 286 may alternatively extend in the second direction. In any case, the photoresist pattern 286 exposes parts of the supporting layer 275 and the capping layer pattern 284, and covers other parts of the supporting layer 275 and capping layer pattern 284.

Figure 8A:
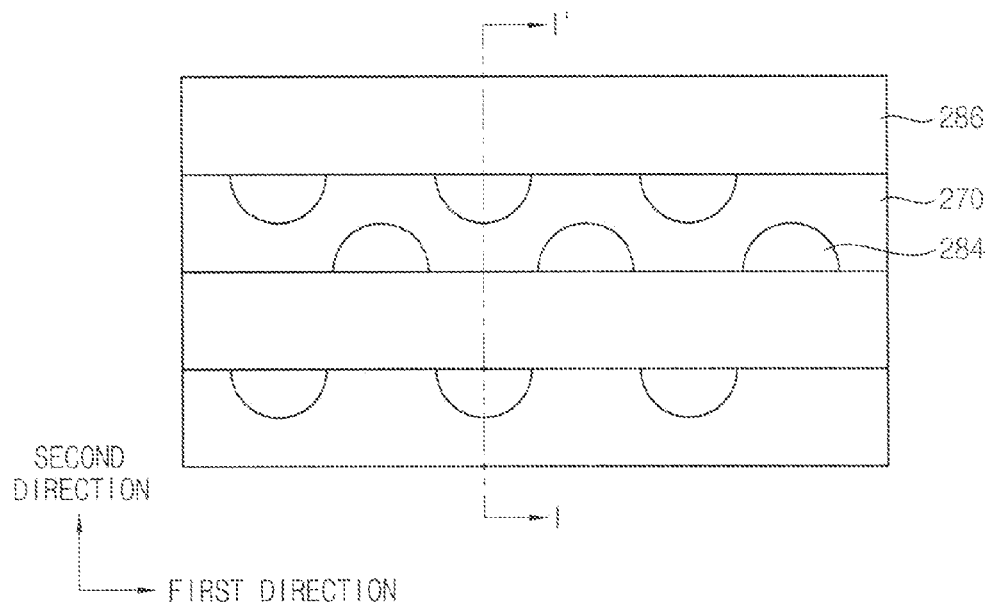
Figure 8B:
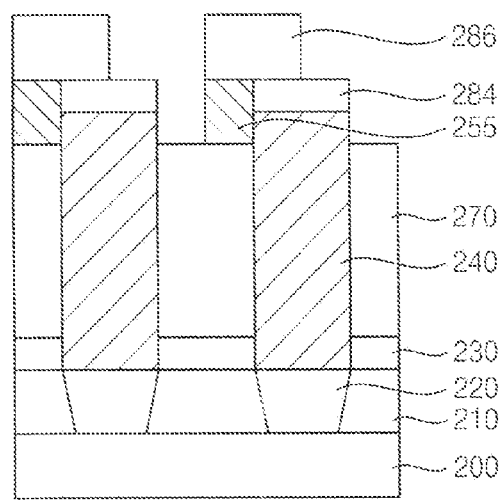

Referring to FIGS. 8A and 8B, the supporting layer 275 is etched using the photoresist pattern 286 as an etching mask, until the first mold layer 270 is exposed. The supporting layer 275 may be etched by a wet etching process and/or a dry etching process. In the present embodiment, the supporting layer 275 is etched by an anisotropic dry etching process. In this process, the capping layer pattern 284 prevents the lower electrode 240 from having etched damage in the etching process for forming the supporting member 255.

In any case, as a result, a supporting member 255 is formed on sidewalls of each lower electrode 240 and the capping layer pattern 284. In particular, the supporting member 255 is attached to an upper portion of the sidewall of each lower electrode 240 and rests on the first mold layer 270. The exact form that the supporting member(s) 255 can take has been described above in connection with FIG. 1.

Referring to FIGS. 9A and 9B, the photoresist pattern 286 is removed, and then the capping layer pattern 284 and the first mold layer 270 are removed by the same etching process or different etching processes carried out in sequence. More specifically, the photoresist pattern 286 may be removed by a stripping process and/or an ashing process. The capping layer pattern 284 and the first mold layer 270 may be etched by a wet etching process using an etching solution or a chemical dry etching process using an etching gas. Examples of the etching solution are solutions of hydrogen fluoride, ammonium fluoride, ammonium hydroxide, and hydrogen peroxide and/or deionized water. Examples of the etching gas are hydrogen fluoride, water vapor, tetrafluoromethane and/or oxygen.

Also, in the case in which the capping layer pattern 284 and the first mold layer 270 are of substantially same material, the capping layer pattern 284 and the first mold layer 270 can be removed simultaneously, i.e., by one etching process. Furthermore, the supporting member 255 is not etched in the process of removing the capping layer pattern 284 and the first mold layer 270 because the supporting member 255 is of material having an etching selectivity with respect to the capping layer pattern 284 and the first mold layer 270.

Next, a dielectric layer (145 in FIG. 1) is conformally formed on the lower electrode 240 and the supporting member 255 to a uniform thickness. The dielectric layer may be formed of an oxide, a nitride and/or a metal oxide by a CVD process, a PECVD process, an ALD process, a sputtering process, or an evaporation process. Then an upper electrode (150 in FIG. 1) is formed on the dielectric layer. The upper electrode may be formed of polysilicon, metals and/or metal compounds by a CVD process, a sputtering process, an ALD process, a PLD process, or an evaporation process.

Figure 10:
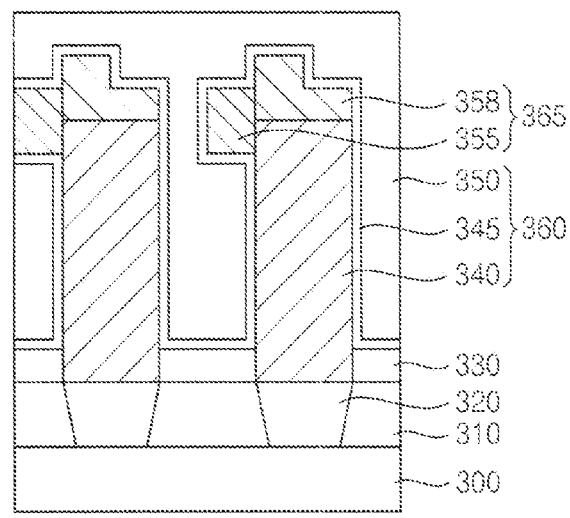
FIG. 10 is a cross-sectional view of another embodiment of a semiconductor device in accordance with the inventive concept.

FIG. 10 illustrates another embodiment of a semiconductor device in accordance with the inventive concept.

Referring to FIG. 10, the semiconductor device includes a substrate 300, an insulating interlayer 310, a plug 320, an etch stop layer 330, and a capacitor 360. The capacitor 360 includes a lower electrode 340, a dielectric layer 345 and an upper electrode 350. The structure, features, composition, etc., of these elements are similar to those of the embodiment of FIG. 1 and thus, will not be described in further detail.

The semiconductor device also includes a supporting member 365. The supporting member 365 is disposed on the upper surface and on an upper portion of the sidewall of the lower electrode 340 to stably support the lower electrode 340. In this respect, the supporting member 365 includes a first supporting element 355 and a second supporting element 358. The first supporting element 355 is disposed against the upper portion of the sidewall of the lower electrode 340. In this respect, the first supporting element 355 may have a structure similar to that of the supporting member 155 described with reference to FIG. 1 (and the corresponding supporting member 255 shown in FIGS. 9A and 9B). The second supporting element 358 is disposed on the upper surface of the lower electrode 340. The second supporting element 358 also contacts the first supporting element 355.

The first supporting element 355 may be of material similar to that of the second supporting element 358. For example, the first and the second supporting elements 355 and 358 may each be of a nitride such as silicon nitride or an oxynitride such as silicon oxynitride. Furthermore, the first and the second supporting elements 355 and 358 may be unitary or may be discrete elements that are nonetheless integral.

Also, the second supporting element 358 may have a substantially "L"-shaped cross section. Hence, the second supporting element 358 may have a step at a substantially central portion thereof. The first supporting element 355 may be attached to not only the upper portion of the sidewall of the lower electrode 340 as mentioned above, but also to a sidewall of the second supporting element 358. In any case, the area of contact between the supporting member 365 and the lower electrode 340 is relatively great because the supporting member 365 contacts both the upper surface and the upper portion of the sidewall of the lower electrode 340. Accordingly, the supporting member 365 adheres strongly to the lower electrode 340. Therefore, the supporting member 365 will not separate from the lower electrode 340 even if the semiconductor device has a minute design rule.

Finally, in a practical example of the embodiment of FIG. 10, the semiconductor device has a plurality of the first supporting elements 355 each extending in the first direction. The first supporting elements 355 may be disposed relative to rows (e.g., first to fourth rows) of the lower electrodes 340 in the same manner as described above with respect to the supporting members 155 of the embodiment of FIG. 1 (and as shown in FIGS. 9A and 9B with respect to the corresponding first supporting members 255).

FIGS. 11 to 18 illustrate an embodiment of a method of manufacturing a semiconductor device of the type shown in FIG. 10, in accordance with the inventive concept.

Figure 11:
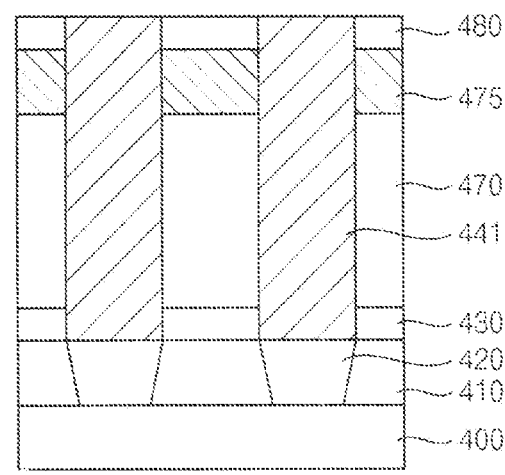
FIGS. 11 to 18 are cross-sectional views illustrating a method of manufacturing a semiconductor device of the type shown in FIG. 10, in accordance with the inventive concept.

Referring to FIG. 11, an insulating interlayer 410, a plug 420, an etch stop layer 430, a first mold layer 470, a supporting layer 475, a second mold layer 480 and a preliminary electrode layer 441 are formed on a substrate 400. In this respect, the method is similar to that part of the method of the previous embodiment shown in and described with reference to FIGS. 2A, 2B, and 3A, 3B. Therefore, this part of the method will not be described in further detail for the sake of brevity.

Figure 12:
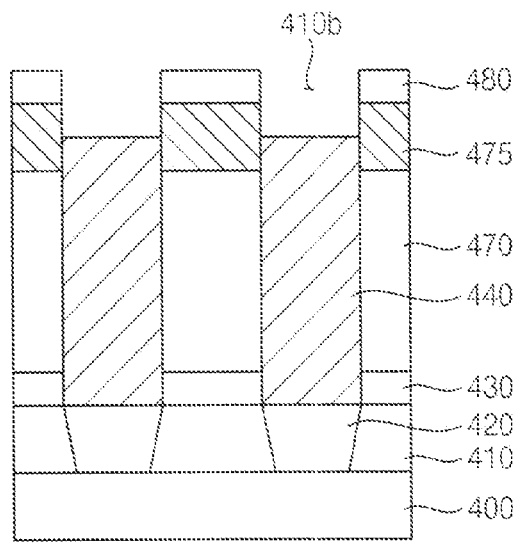

Referring to FIG. 12, an upper portion of the preliminary lower electrode layer 441 is removed to form a lower electrode 440 on the plug 420, and a second opening 410b on the lower electrode 440. This part of the method is similar to that shown in and described with reference to FIG. 4. Therefore, this part of the method will also not be described in further detail for the sake of brevity.

Figure 13:
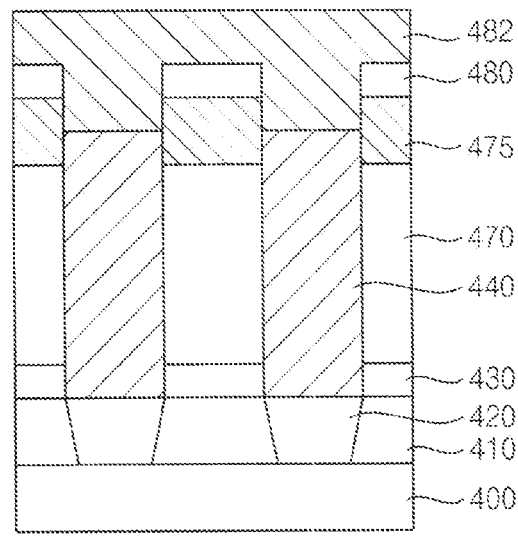

Referring to FIG. 13, a capping layer 482 is formed on the lower electrode 440 and the second mold layer 480 to fill the second opening 410b. The capping layer 482 is formed of material that has an etching selectivity with respect to the second mold layer 480, the first mold layer 470 and/or the insulating interlayer 410. In all other respects as well, this part of the method is similarly to that of the previous embodiment described above with reference to FIG. 5

Figure 14:
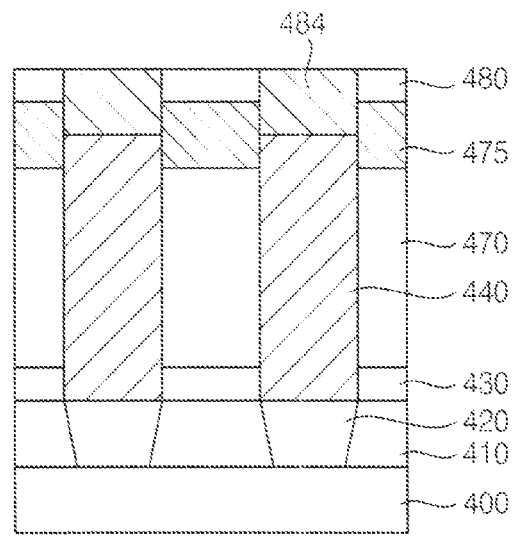

Referring to FIG. 14, an upper portion of the capping layer 482 is removed until the second mold layer 480 is exposed. In this respect, the upper portion of the capping layer 482 may be removed by a CMP process and/or an etch-back process. As a result, remnants of the capping layer 482 remain in the second openings 210b, respectively. The remnants constitute a capping layer pattern 484 formed on the lower electrodes 440.

Figure 15:
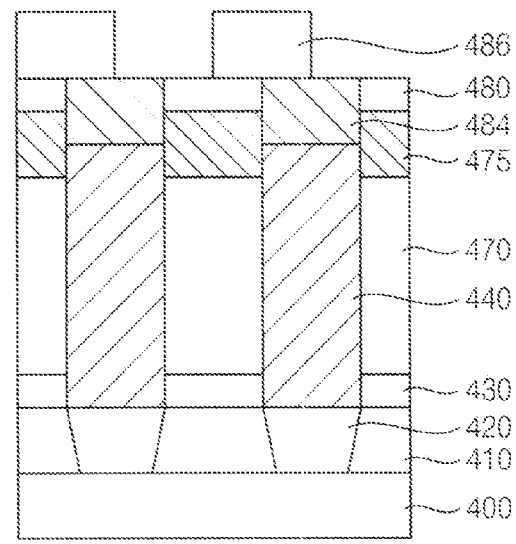

Referring to FIG. 15, a photoresist pattern 486 is formed on the second mold layer 480 and the capping layer pattern 484. The photoresist pattern 486 exposes at least a portion of the second mold layer 480 and at least a portion of the capping pattern 484. In this respect, the photoresist pattern 486 may have the same pattern of lines and disposition relative to the underlying second mold layer 480 and supporting layer 475 as shown in and described with reference to FIGS. 7A and 7B. However, in this embodiment, photoresist pattern 486 also covers one part of and exposes another part of the second mold layer 480 which remains on the supporting layer 475.

Figure 16:
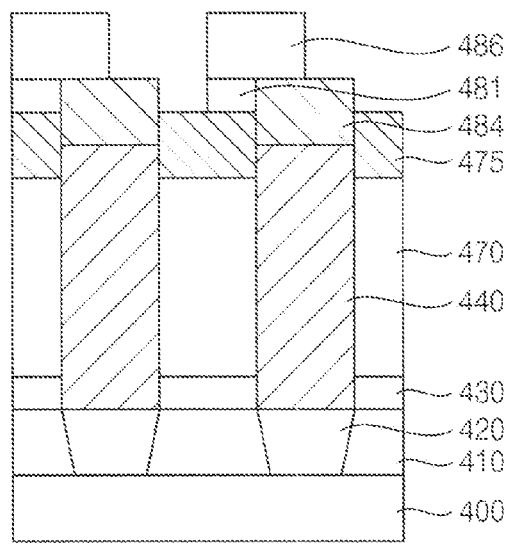

Referring to FIG. 16, the second mold layer 480 is etched by a wet etching process and/or a dry etching process using the photoresist pattern 486 as an etching mask, thereby forming a second mold layer pattern 481. As a result, a portion of the supporting layer 475 is exposed by the second mold layer pattern 481. In the present embodiment, the second mold layer 480 is etched by an anisotropic dry etching process. However, the capping layer pattern 484 remains on the lower electrode 340, so that the capping layer pattern 484 prevents the lower electrode 440 from being damaged during the etching process of forming the second mold layer pattern 481.

Figure 17:
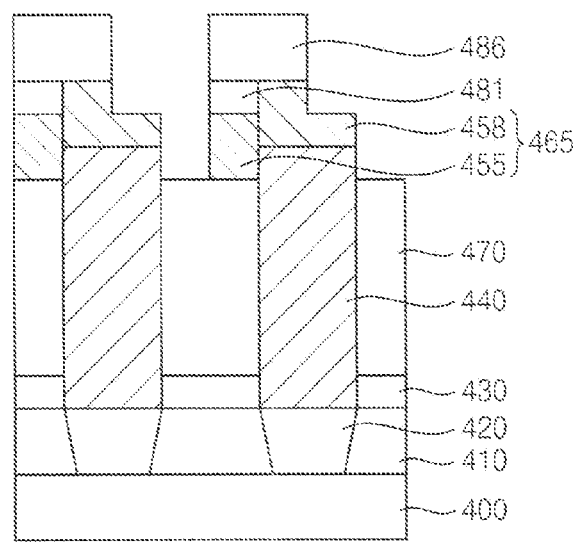

Referring to FIG. 17, still using the photoresist pattern 486 as an etching mask, the supporting layer 475 and the capping layer pattern 484 are etched to form a supporting member 465 having a first supporting element 455 and a second supporting element 458. In this respect, parts of the supporting layer 475 and the capping layer pattern 484 may be removed by an anisotropic dry etching process. In the case in which the supporting layer 475 is of material similar to that of the capping layer pattern 484, the supporting layer 475 and the capping layer pattern 484 may be simultaneously etched at substantially the same rate. That is, the first and the second supporting elements 455 and 458 may be simultaneously formed using a single etching process.

The supporting members 465 formed by this process correspond to the supporting members 365 shown in and described above with respect to FIG. 10. Thus, the first supporting element 455 on the upper portion of the sidewall of the lower electrode 440 and the second supporting element 458 on the upper surface of the lower electrode 440 correspond to the first supporting element 355 and the second supporting element 358, respectively. Accordingly, the configuration, advantages, etc. of the supporting members 465 will not be described in further detail.

Figure 18:
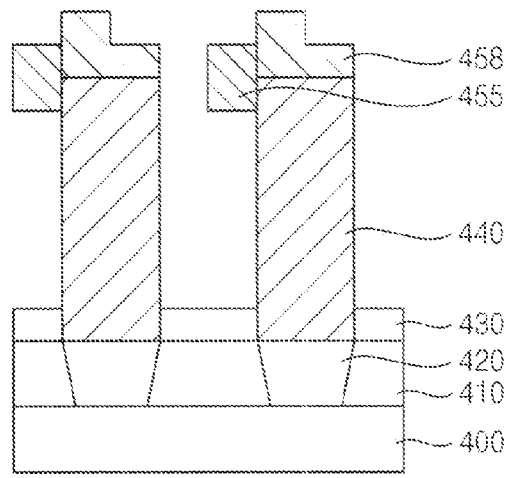

Referring to FIG. 18, the photoresist pattern 486 is removed from the supporting members 465. The photoresist pattern 486 may be removed by a stripping process and/or an ashing process. Subsequently, the second mold layer pattern 481, the first mold layer 470 and the second mold layer pattern 481 are removed from the supporting members 465. The first mold layer 470 and the second mold layer pattern 481 may be removed by a wet etching process using an etching solution or a chemical dry etching process using an etching gas. Examples of suitable etching solutions are solutions of hydrogen fluoride, ammonium hydroxide, hydrogen peroxide, and ammonium fluoride, and/or deionized water. Examples of the etching gas are hydrogen fluoride, water vapor, tetrafluoromethane, and/or oxygen.

When the first mold layer 470 and the second mold layer pattern 481 are each of an oxide, the first mold layer 470 and the second mold layer pattern 481 may be removed simultaneously. However, the supporting member 465 is not be etched during this etching process of removing the first mold layer 470 and the second mold layer pattern 481 because the supporting member 465 is of material different from those of the first mold layer 470 and the second mold layer pattern 481. More specifically, the supporting member 465 is not etched when the first mold layer 470 and the second mold layer pattern 481 are removed because the supporting member 465 is of material having an etch selectivity with respect to the material of the first mold layer 470 and the second mold layer 480.

Next, a dielectric layer (corresponding to dielectric layer 345 in FIG. 10) and an upper electrode (corresponding to upper electrode 350 in FIG. 10) are formed on the lower electrode 440 and the supporting member 465. The dielectric layer and the upper electrode may be formed of a metal oxide and conductive material, respectively. Hence, a capacitor is provided on the substrate 400.

Figure 19:
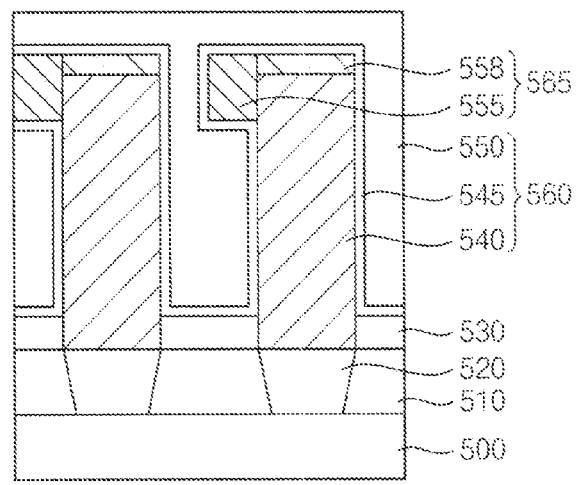
FIG. 19 is a cross-sectional view of another embodiment of a semiconductor device in accordance with the inventive concept.

FIG. 19 illustrates another embodiment of a semiconductor device in accordance with the inventive concept.

Referring to FIG. 19, the semiconductor device includes a substrate 500, an insulating interlayer 510, a plug 520, an etch stop layer 530, and a capacitor 560. The capacitor 560 includes a lower electrode 540, a dielectric layer 545 and an upper electrode 550. The structure, features, composition, etc., of these elements are similar to those of the embodiments of FIGS. 1 and 10 and thus, will not be described in further detail.

The semiconductor device also includes a supporting member 565. The supporting member 565 is disposed on the upper surface and on an upper portion of the sidewall of the lower electrode 540 to stably support the lower electrode 540. In this respect, the supporting member 565 includes a first supporting element 555 and a second supporting element 558. The first supporting element 555 is disposed against an upper portion of the sidewall of the lower electrode 540, and the second supporting element 558 is disposed on the upper surface of the lower electrode 540. The first and the second supporting elements 555 and 558 may be discrete but integral elements or may be unitary. Furthermore, the first supporting element 555 may be of material similar to that of the second supporting element 558. For example, each of the first and the second supporting elements 555 and 558 may be of silicon nitride, silicon oxynitride, amorphous silicon, or amorphous carbon.

Also, in an example of this embodiment in which the first and second supporting elements 555 and 558 are discrete elements, as shown in FIG. 19, the first supporting element 555 protrudes above the lower electrode 540, the second supporting element 558 contacts the portion of the first supporting element 555 which protrudes above the lower electrode 540, and upper surfaces of the first and the second supporting elements 555 and 558 are coplanar. In other words, the thickness of the second supporting element 558 is similar to the thickness of the portion of the first supporting element 555 which protrudes above the lower electrode 540.

Finally, in a practical example of the embodiment of FIG. 19, the semiconductor device has a plurality of the first supporting elements 565 each extending in the first direction. The supporting members 555 and more particularly, the first supporting elements 565 of the supporting members, may be disposed relative to rows (e.g., first to fourth rows) of the lower electrodes 540 in the same manner as described above with respect to the supporting members 155 of the embodiment of FIG. 1 (and as shown in FIGS. 9A and 9B with respect to the corresponding first supporting members 255).

FIGS. 20 to 23 illustrate a method of manufacturing a semiconductor device of the type shown in FIG. 19, in accordance with the inventive concept.

Figure 20:
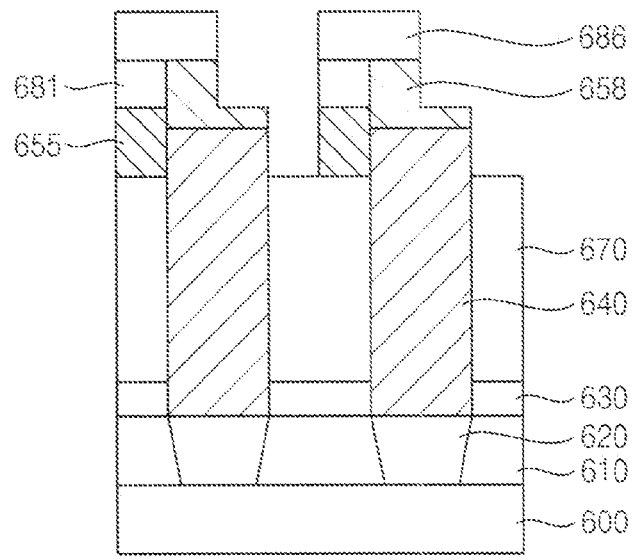
FIGS. 20 to 23 are cross-sectional views illustrating a method of manufacturing a semiconductor device of the type shown in FIG. 19, in accordance with the inventive concept.

Referring to FIG. 20, an insulating interlayer 610, a plug 620, an etch stop layer 630, a lower electrode 640, a first mold layer 670, a first supporting element 655, a preliminary second supporting element 658 and a second mold layer pattern 681 are formed on a substrate 600. Up to this point in the method, the processes are similar to the processes described above with reference to FIGS. 2A, 2B, 3A, 3B and 11 to 17, including the forming of a photoresist pattern 686 and use of the photoresist pattern 686 as an etch mask to form the second mold layer pattern 681 and first supporting element 655. Therefore, these processes will not be described in further detail.

Figure 21:
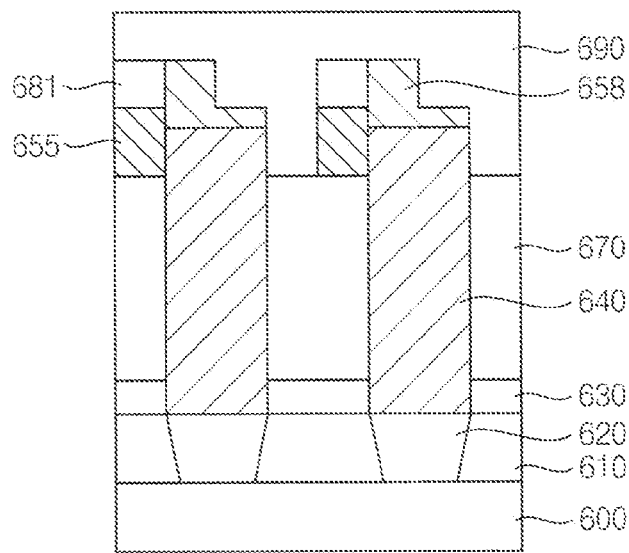

Referring to FIG. 21, the photoresist pattern 686 is removed. Then, a second capping layer 690 is formed on the second mold layer pattern 681 and the second supporting element 658. The second capping layer 690 may be formed of material similar to that of the first mold layer 670 and/or that of the second mold layer pattern 681. For example, the second capping layer 690 may be of silicon oxide, such as TEOS, an HDP-CVD oxide, PSG, USG, BPSG, FOX, TOSZ, or SOG. Thus, the second capping layer 690 may be formed by a CVD process, a PECVD process, a spin coating process, or an HDP-CVD process.

Figure 22:
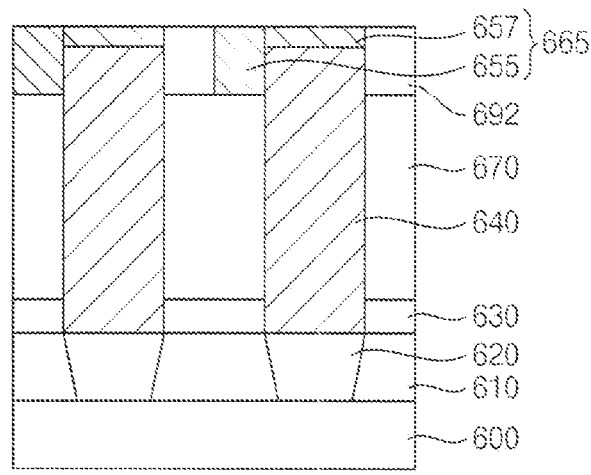

Referring to FIG. 22, an upper portion of the second capping layer 690, an upper portion of the preliminary second supporting element 658 and the second mold layer pattern 681 are removed until the first supporting element 655 is exposed. In this respect, the upper portion of the second capping layer 690, the upper portion of the preliminary second supporting element 658 and the second mold layer pattern 681 may be removed by a CMP process and/or an etchback process. However, the preliminary second supporting element 658 prevents the lower electrode 640 from being damaged during this process. As a result, a second capping layer pattern 692 and a second supporting element 657 are formed on the first mold layer 670. Also, at this time, the upper surface of the second supporting element 657 and the upper surface of the first supporting member 655 are coplanar. The first and second supporting elements 655 and 657 constitute a supporting member 665.

Figure 23:
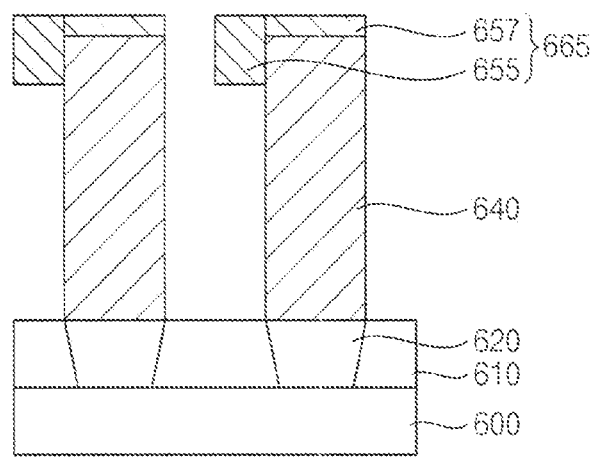

Referring to FIG. 23, the second capping layer pattern 692 and the first mold layer 670 are removed. When the second capping layer pattern 692 and the first mold layer 670 each comprise an oxide, the second capping layer pattern 692 and the first mold layer 670 may be removed simultaneously, i.e., by a single etching process. The etching process may be a wet etching process using an etching solution or a chemical dry etching process using an etching gas. On the other hand, the supporting member 665 is not etched while the second capping layer pattern 692 and the first mold layer 470 are removed because the supporting member 665 is of material different from and having an etch selectivity with respect to the material of the second capping layer pattern 692 and the first mold layer 470.

Next, a dielectric layer (corresponding to layer 545 in FIG. 19) is formed on the lower electrode 640 and the supporting member 665, and then an upper electrode (corresponding to layer 5550 in FIG. 19) is formed on the dielectric layer. Hence, the forming of a capacitor on the substrate 600 is completed.

According to an aspect of examples of the inventive concept described above, at least one supporting member is provided to stably support and effectively protect a lower electrode. More specifically, the supporting member prevents a lower electrode of a capacitor from leaning, falling down, or collapsing during and from being damaged by the processes of fabricating the capacitor.

With respect to the latter, the supporting member can prevent the lower electrode from being damaged during etching one or more etching processes carried out after the supporting member is initially formed because a portion of the supporting member protrudes above the upper surface of the lower electrode. In particular, the lower electrode can be effectively prevented from being damaged by the etching processes used for forming the supporting member especially when one portion of the supporting member enclosing a circumferential part of the upper portion of the lower electrode protrudes above the upper surface of the lower electrode and another portion of the supporting member covers the upper surface of the lower electrode.

According to another aspect of examples of the inventive concept described above, a relatively tall lower electrode may be formed because the structural stability of such an electrode is enhanced by a supporting member that encloses at least a circumferential part of an upper portion of the lower electrode and additionally may cover the lower electrode. Therefore, practicing the inventive concept may provide capacitors having considerably improved capacitances, as well as semiconductor devices having greatly enhanced storage capacities even for those semiconductor devices fabricated according to a minute design rule.

Furthermore, in the above-described examples of the inventive concept in which portions of the supporting member contact both the upper surface and sidewall of the lower electrode, respectively, the supporting member and the lower electrode are strongly adhered to one another. That is, the supporting member can not be easily separated from the lower electrode even if the supporting member and the lower electrode are extremely fine.

Finally, as the detailed written description above makes clear, the inventive concept may be advantageously employed in semiconductor devices and methods of fabricating the same, in which a plurality of rows of tall (vertically elongated) lower electrodes are provided/formed on a substrate. In these cases, a respective supporting member can be provided to support and protect all of the lower electrodes in two adjacent rows. Also, the lower electrodes in one of the rows can be offset relative to the lower electrodes in the other row such that a device having a high integration density and large storage capacity can be provided.

Finally, embodiments of the inventive concept have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. A semiconductor device comprising:
   a substrate;
   a lower electrode on the substrate;
   a supporting member enclosing an upper portion of the lower electrode and protruding above the lower electrode,
   wherein the supporting member has a lower section adjacent a sidewall surface of the lower electrode and an upper section located above the level of the uppermost point of the lower electrode;
   a dielectric layer extending over and conformed to the topography of the lower electrode and the supporting member, and an upper electrode disposed on the dielectric layer.

2. The semiconductor device of claim 1, wherein the lower electrode has a sidewall surface and an upper surface at the top of the sidewall surface, and
   the lower section of the supporting member protrudes laterally from an upper portion only of the sidewall surface of the lower electrode.

3. The semiconductor device of claim 1, wherein the lower electrode has the form of a pillar and includes a sidewall surface and an upper surface at the top of the sidewall surface, and the lower section of the supporting member encloses only substantially half of an upper portion of the sidewall surface of the lower electrode in the circumferential direction of the lower electrode.

4. The semiconductor device of claim 1, wherein the supporting member is of material having an etch selectivity with respect to the lower electrode.

5. The semiconductor device of claim 4, wherein the supporting member comprises silicon nitride, silicon oxynitride, amorphous silicon or amorphous carbon.

6. The semiconductor device of claim 1, wherein the lower electrode has a sidewall surface and an upper surface at the top of the sidewall surface, and
   the supporting member comprises:
   a first supporting portion protruding consisting of said lower section and said upper section above the lower electrode and enclosing an upper portion of the sidewall of the lower electrode; and
   a second supporting portion disposed vertically on the upper surface of the lower electrode.

7. The semiconductor device of claim 6, wherein the first and the second supporting portions are contiguous with one another.

8. The semiconductor device of claim 6, wherein the second supporting portion has an L-shaped cross section.

9. The semiconductor device of claim 1, further comprising:
- an insulating interlayer disposed on the substrate;
- a plug disposed on the substrate and extending through the insulating interlayer; and
- an etch stop layer disposed on the insulating interlayer.

10. The semiconductor device of claim 9, wherein the lower electrode is electrically connected to the plug and a lower portion of the lower electrode is buried in the etch stop layer.

11. A semiconductor device comprising:
- a substrate;
- a first row of lower electrodes aligned with one another in a first direction on the substrate, and a second row of lower electrodes aligned with one another in the first direction on the substrate such that the first and second rows of the lower electrodes are substantially parallel, and each of the lower electrodes elongated in a direction substantially perpendicular to the substrate;
- a first supporting member contacting upper portions of both the lower electrodes in the first row and the lower electrodes in the second row, and the first supporting member protruding above the lower electrodes,
- wherein the first supporting member has a lower section disposed adjacent a sidewall surface of each of the lower electrodes and an upper section disposed above the level of the uppermost point of each of the lower electrodes;
- a dielectric layer disposed on the lower electrodes and the supporting member; and
- an upper electrode disposed on the dielectric layer.

12. The semiconductor device of claim 11, further comprising a third row of lower electrodes aligned with one another in the first direction on the substrate, and a fourth row of lower electrodes aligned with one another in the first direction on the substrate such that the third and the fourth rows of the lower electrodes are substantially parallel to the first and the second rows of the lower electrodes, the third row being adjacent to the second row as located to one side of the second row opposite that which is adjacent the first row, and the fourth row being adjacent to the third row as located to one side of the third row opposite that which is adjacent the second row, and
- a second supporting member contacting upper portions of both the lower electrodes in the third row and the lower electrodes in the fourth row, and the supporting member protruding above the lower electrodes in the third and fourth rows,
- wherein the second supporting member has a lower section adjacent a sidewall surface of each of the lower electrodes in the third and fourth rows and an upper section disposed above the level of the uppermost point of each of the lower electrodes in the third and fourth rows.

13. The semiconductor device of claim 12, wherein each of the lower electrodes is in the form of a pillar and has a cross section that is circular, polygonal or elliptical.

14. The semiconductor device of claim 11, the lower electrodes each have a sidewall surface and an upper surface at the top of the sidewall surface, and further comprising a third supporting member disposed vertically on the upper surfaces of the lower electrodes in the first and second rows.

15. The semiconductor device of claim 14, wherein the first and third supporting members are contiguous with one another.

16. The semiconductor device of claim 14, wherein the third supporting member covers the entire upper surface of each of the lower electrodes in the first and second rows.

* * * * *